(12) United States Patent
Park et al.

(10) Patent No.: US 10,840,347 B2
(45) Date of Patent: Nov. 17, 2020

(54) SEMICONDUCTOR DEVICE WITH NEGATIVE DIFFERENTIAL TRANSCONDUCTANCE AND METHOD OF MANUFACTURING THE SAME

(71) Applicant: RESEARCH & BUSINESS FOUNDATION SUNGKYUNKWAN UNIVERSITY, Suwon-si (KR)

(72) Inventors: Jin Hong Park, Hwaseong-si (KR); Jaewoo Shim, Bucheon-si (KR); Dong Ho Kang, Busan (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 109 days.

(21) Appl. No.: 16/005,792

(22) Filed: Jun. 12, 2018

(65) Prior Publication Data
US 2018/0358446 A1 Dec. 13, 2018

(30) Foreign Application Priority Data

Jun. 12, 2017 (KR) .......................... 10-2017-0073360

(51) Int. Cl.
*H01L 29/423* (2006.01)
*H01L 29/66* (2006.01)
(Continued)

(52) U.S. Cl.
CPC ........ *H01L 29/42364* (2013.01); *B82Y 10/00* (2013.01); *B82Y 15/00* (2013.01);
(Continued)

(58) Field of Classification Search
CPC ........... H01L 29/42364; H01L 29/1606; H01L 29/267; H01L 29/66015; H01L 31/1136; B82Y 10/00; B82Y 15/00
See application file for complete search history.

(56) References Cited

U.S. PATENT DOCUMENTS 5,468,978 A * 11/1995 Dowben ................ H01L 29/24
257/183
2008/0106926 A1 * 5/2008 Brubaker ................ G11C 11/24
365/148
(Continued)

FOREIGN PATENT DOCUMENTS

KR 10-2015-0056372 A 5/2015

OTHER PUBLICATIONS

Roy, Tania, et al., "Dual-Gated MoS2/WSe2 van der Waals Tunnel Diodes and Transistors", Acs Nano, vol. 9, Issue 2, Jan. 2015, pp. 2071-2079.
(Continued)

*Primary Examiner* — Fernando L Toledo
*Assistant Examiner* — Neil R Prasad
(74) *Attorney, Agent, or Firm* — NSIP Law

(57) ABSTRACT

Provided is a semiconductor device with negative differential transconductance. The semiconductor device includes a substrate, a gate electrode formed on the substrate, an insulating layer formed on the gate electrode, a source electrode material layer formed on the insulating layer, a semiconductor material layer formed on the insulating layer to be hetero-joined to the source electrode material layer, a source electrode formed on the source electrode material layer, and a drain electrode formed on the semiconductor material layer. A work function of the source electrode material layer is controlled by a gate voltage applied through the gate electrode, and the source electrode material layer shows negative differential transconductance depending on a level of the gate voltage.

10 Claims, 11 Drawing Sheets

(51) Int. Cl.
     *H01L 29/267*   (2006.01)
     *H01L 29/16*    (2006.01)
     *B82Y 15/00*    (2011.01)
     *H01L 31/113*   (2006.01)
     *B82Y 10/00*    (2011.01)

(52) U.S. Cl.
     CPC ........ *H01L 29/1606* (2013.01); *H01L 29/267* (2013.01); *H01L 29/66015* (2013.01); *H01L 31/1136* (2013.01)

(56) References Cited

U.S. PATENT DOCUMENTS

| | | | |
|---|---|---|---|
| 2017/0062234 A1* | 3/2017 | Bajaj | H01L 29/0847 |
| 2017/0243791 A1* | 8/2017 | Jacob | H01L 29/267 |
| 2017/0352753 A1* | 12/2017 | Nagahisa | H01L 29/7786 |

OTHER PUBLICATIONS

Nourbakhsh, A., et al., "Transport Properties of a MoS2/WSe2 Heterojunction Transistor and its Potential for Application", *Nano letters*, vol. 16, Issue 2, Jan. 2016, pp. 1359-1366.
Shim, Jaewoo, et al., "Phosphorene/Rhenium Disulfide Heterojunction-Based Negative Differential Resistance Device for Multi-Valued Logic", *Nature Communications*, vol. 7, Nov. 2016, pp. 1-8.

\* cited by examiner

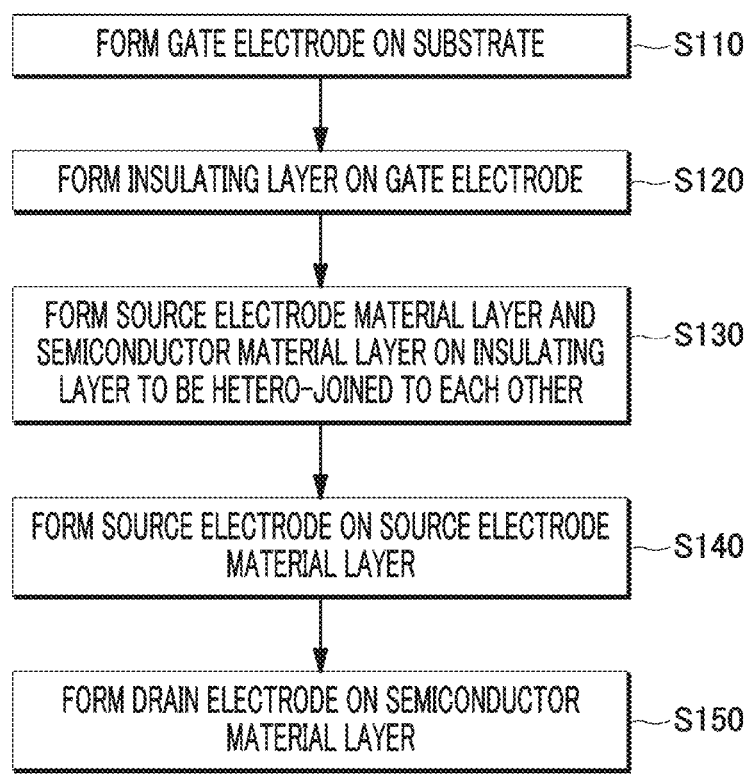

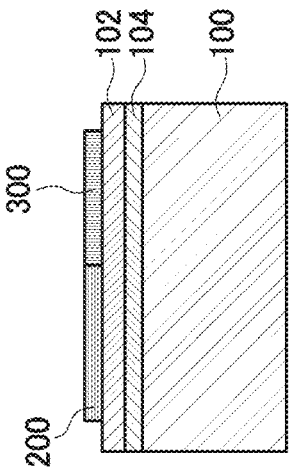
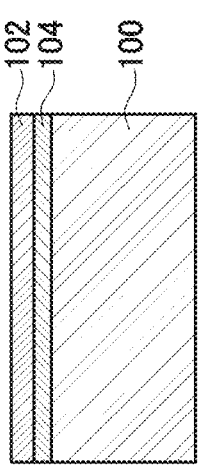
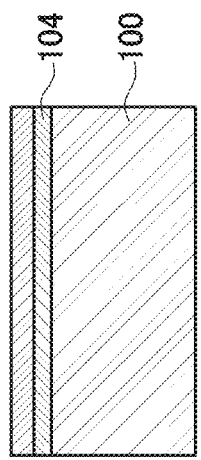
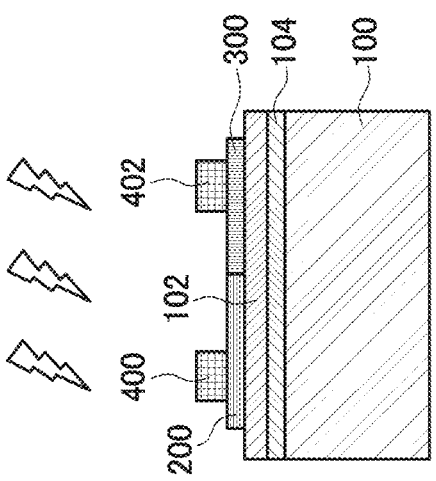
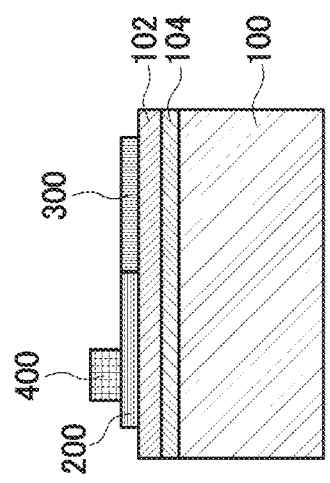

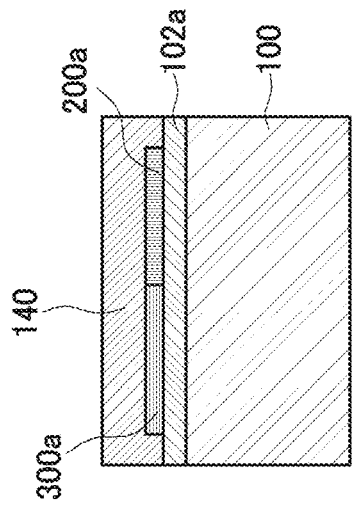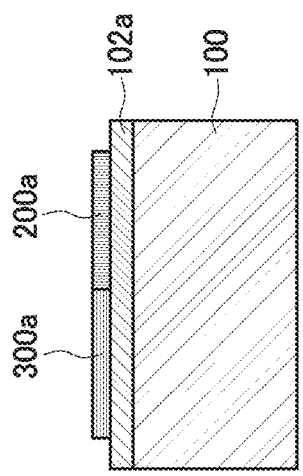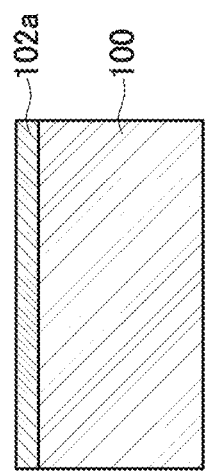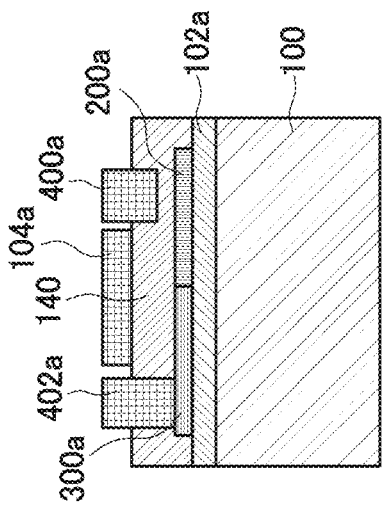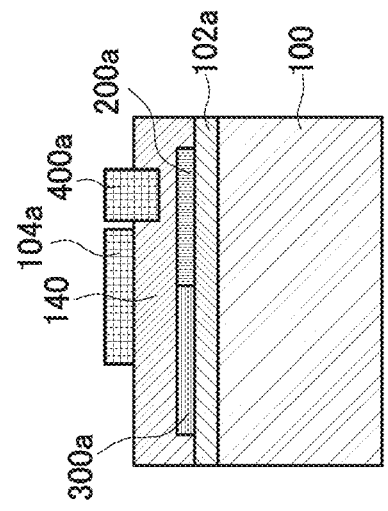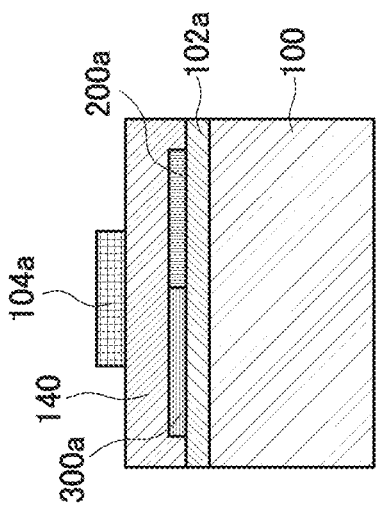

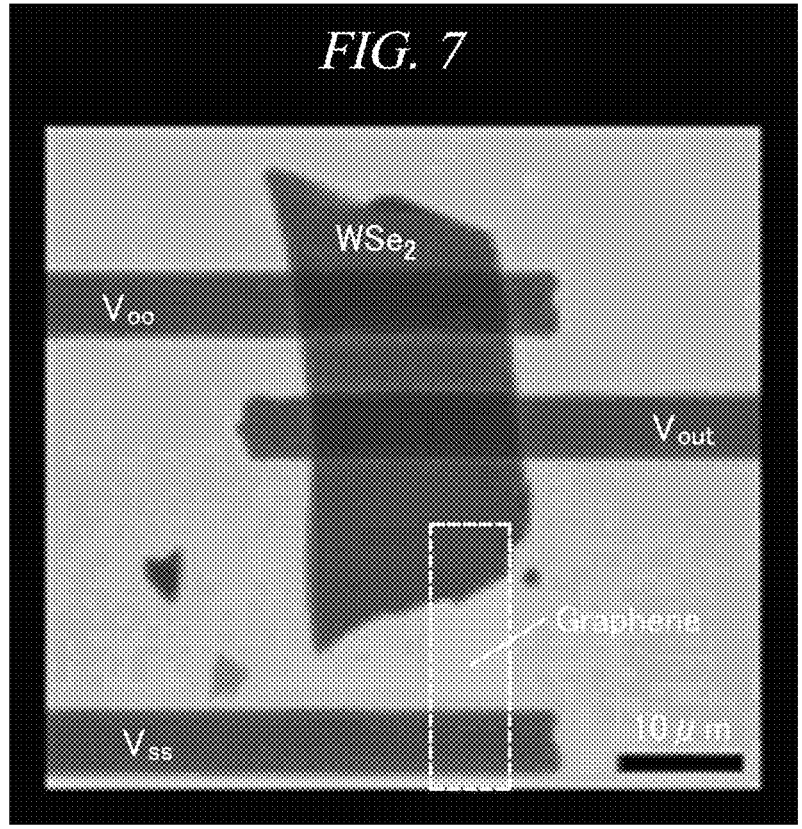

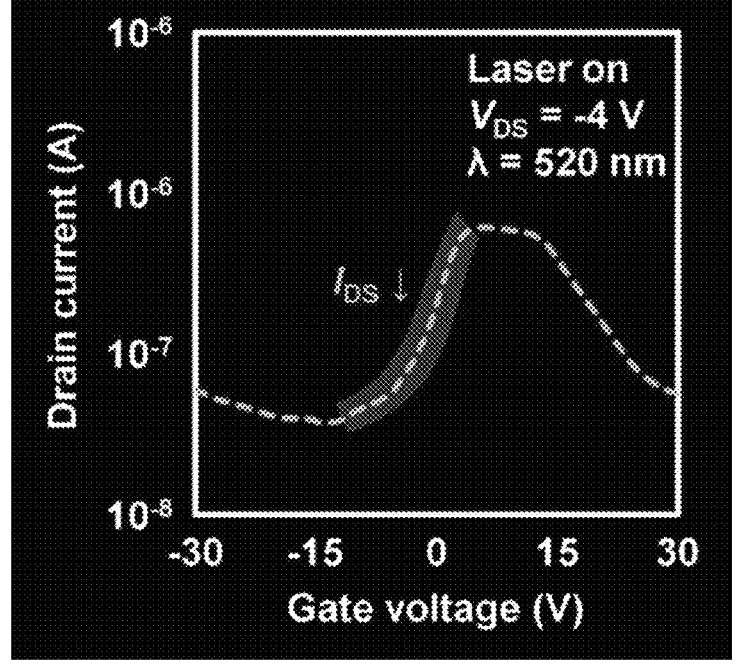

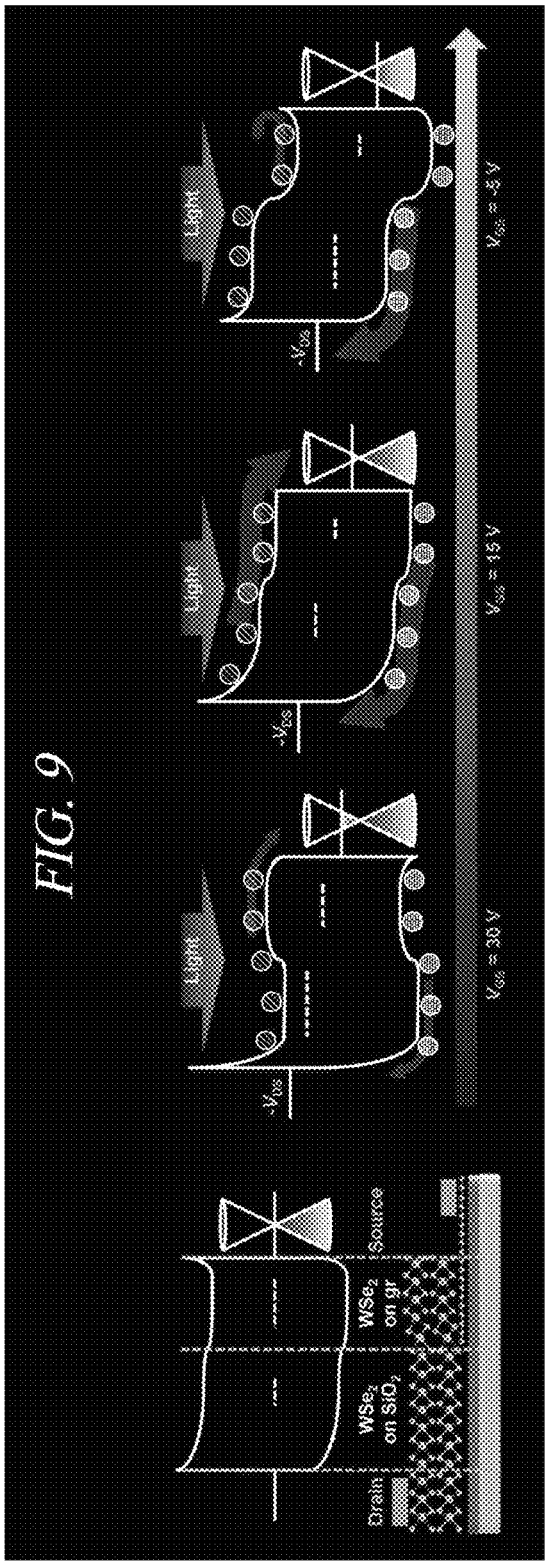

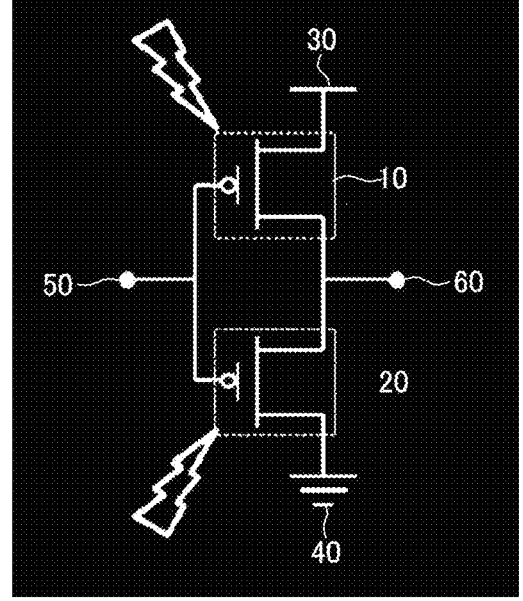

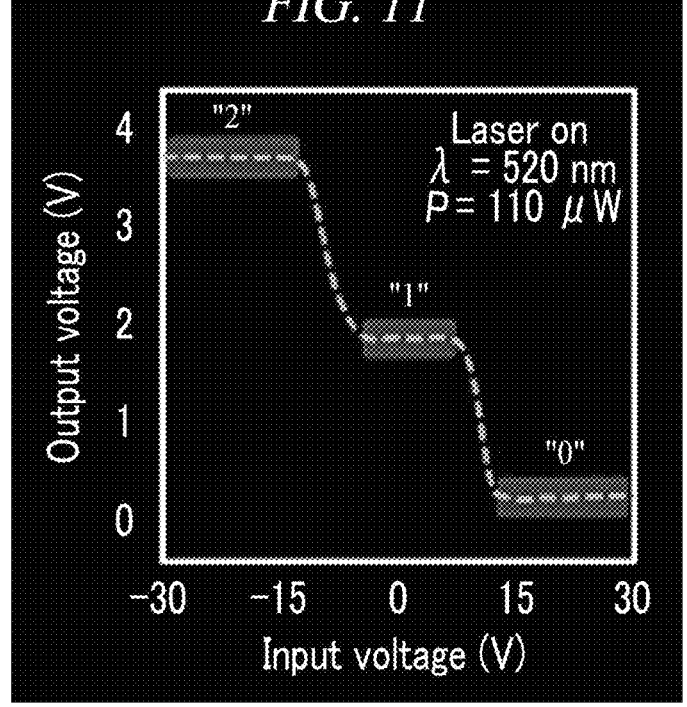

SEMICONDUCTOR DEVICE WITH NEGATIVE DIFFERENTIAL TRANSCONDUCTANCE AND METHOD OF MANUFACTURING THE SAME

CROSS-REFERENCE TO RELATED APPLICATION

This application claims the benefit of Korean Patent Application No. 10-2017-0073360 filed on Jun. 12, 2017, the entire disclosures of which are incorporated herein by reference.

TECHNICAL FIELD

The present disclosure relates to a semiconductor device with negative differential transconductance and a method of manufacturing the same.

BACKGROUND

In a conventional binary logic circuit-based computer, numerous components and conducting wires need to be integrated to process massive information, which causes high electric power consumption and heat generation. In order to reduce electric power to be consumed when a circuit is driven, studies related to a multi-valued logic circuit are being conducted worldwide. The multi-valued logic circuit refers to a circuit capable of displaying three or more logic states using "0", "1", and "2" beyond the conventional binary system using "0" and "1". With the use of a logic circuit-based computing technology capable of understanding ternary or higher numeral system, the same information processing function can be performed using fewer components and conducting wires with less electric power consumption.

In such a multi-valued semiconductor device, the current decreases despite an increase in the voltage during a specific voltage section. Thus, the multi-valued semiconductor device shows characteristics of diodes with various threshold voltages. Therefore, a multi-valued logic circuit can be implemented using the multi-valued semiconductor device. The multi-valued semiconductor device is generally known as being observed in an Esaki diode, a resonant tunneling diode, a single electron transistor, and the like. The Esaki diode shows a negative differential resistance (NDR) through interband tunneling based on a heavily doped PN junction, and, thus, it is difficult to obtain two or more current peaks.

Meanwhile, it is known that the resonant tunneling diode and the single electron transistor can obtain two or more current peaks. The resonant tunneling diode can obtain multiple current peaks since the number of current peaks is determined by the number of specific energy levels in a channel layer. However, its process is very complex. The single electron transistor can also obtain multiple current peaks similarly to the resonant tunneling diode. However, it is very difficult to its process since very small quantum dots of 10 nm or less need to be formed. Also, the single electron transistor shows a negative differential resistance only at an extremely low temperature and thus is difficult to be applied to a circuit.

In this regard, Korean Patent Laid-open Publication No. 2015-0056372 (entitled "Graphene device including separated junction contact and method of fabricating the same") discloses a graphene device including separated junction contacts so that an off-current characteristic is improved, and a method of fabricating the same.

SUMMARY

In view of the foregoing, the present disclosure provides a method of manufacturing a device which has negative differential transconductance when light is irradiated to the device with a controlled potential barrier between a channel layer and a source electrode. Further, the present disclosure provides a method of implementing a ternary inverter circuit using two components, i.e., the manufactured device having negative differential transconductance and a p- or n-channel transistor.

However, problems to be solved by the present disclosure are not limited to the above-described problems. There may be other problems to be solved by the present disclosure.

An aspect of the present disclosure provides a semiconductor device with negative differential transconductance. The semiconductor device includes a substrate, a gate electrode formed on the substrate, an insulating layer formed on the gate electrode, a source electrode material layer formed on the insulating layer, a semiconductor material layer formed on the insulating layer to be hetero-joined to the source electrode material layer, a source electrode formed on the source electrode material layer, and a drain electrode formed on the semiconductor material layer. A work function of the source electrode material layer is controlled by a gate voltage applied through the gate electrode, and the source electrode material layer shows negative differential transconductance depending on a level of the gate voltage.

Another aspect of the present disclosure provides a semiconductor device with negative differential transconductance. The semiconductor device includes a substrate, an insulating layer formed on the substrate, a source electrode material layer and a semiconductor material layer formed on the insulating layer to be hetero-joined to each other, a gate oxide film formed on the source electrode material layer and the semiconductor material layer, a gate electrode formed on the gate oxide film, a source electrode formed on the gate oxide film to be in contact with the source electrode material layer, and a drain electrode formed in an area where the semiconductor material layer is located on the gate oxide film as being spaced from the gate electrode and the source electrode. A work function of the source electrode material layer is controlled by a gate voltage applied through the gate electrode, and the source electrode material layer shows negative differential transconductance depending on a level of the gate voltage.

Yet another aspect of the present disclosure provides a ternary inverter capable of outputting three logic states. The ternary inverter includes a first switching device and a second switching device connected in series between a power voltage and a ground port. Input data are applied through gate electrodes of the first switching device and the second switching device, output data are output through connection nodes of the first switching device and the second switching device, and any one of the first switching device and the second switching device is a semiconductor device that has two ranges of channel resistance depending on the input data and the other is a semiconductor device that shows negative differential transconductance depending on the input data and has three ranges of channel resistance.

Still another aspect of the present disclosure provides a method of manufacturing a semiconductor device with negative differential transconductance, including forming a gate electrode on a substrate, forming an insulating layer on the gate electrode, forming a source electrode material layer and a semiconductor material layer on the insulating layer to be hetero-joined to each other, forming a source electrode on the source electrode material layer, and forming a drain electrode on the semiconductor material layer. A work function of the source electrode material layer is controlled by a gate voltage applied through the gate electrode, and the source electrode material layer shows negative differential transconductance depending on a level of the gate voltage.

Still another aspect of the present disclosure provides a method of manufacturing a semiconductor device with negative differential transconductance, including forming an insulating layer on a substrate, forming a source electrode material layer and a semiconductor material layer on the insulating layer to be hetero-joined to each other, forming a gate oxide film on the source electrode material layer and the semiconductor material layer, forming a gate electrode on the gate oxide film, forming a source electrode on the gate oxide film to be in contact with the source electrode material layer, and forming a drain electrode in an area where the semiconductor material layer is located on the gate oxide film as being spaced from the gate electrode and the source electrode. A work function of the source electrode material layer is controlled by a gate voltage applied through the gate electrode, and the source electrode material layer shows negative differential transconductance depending on a level of the gate voltage.

An embodiment of the present disclosure provides a method of easily implementing a device with negative differential transconductance by heterojunction of a material whose work function can be controlled by a gate voltage and a semiconductor material having a band gap. Further, it is possible to implement a ternary inverter circuit capable of displaying three logic states by connecting two components, i.e., a device having negative differential transconductance and a p- or n-channel transistor, in series. Accordingly, it is possible to remarkably reduce the number of the components required for a conventional highly integrated electron circuit.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3 is a flowchart provided to explain a method of manufacturing the semiconductor device with negative differential transconductance illustrated in FIG. 1A and FIG. 1B.

FIG. 4A illustrates a detailed process provided to explain the method of manufacturing a semiconductor device with negative differential transconductance illustrated in FIG. 3.

FIG. 4B illustrates a detailed process provided to explain the method of manufacturing a semiconductor device with negative differential transconductance illustrated in FIG. 3.

FIG. 4C illustrates a detailed process provided to explain the method of manufacturing a semiconductor device with negative differential transconductance illustrated in FIG. 3.

FIG. 4D illustrates a detailed process provided to explain the method of manufacturing a semiconductor device with negative differential transconductance illustrated in FIG. 3.

FIG. 4E illustrates a detailed process provided to explain the method of manufacturing a semiconductor device with negative differential transconductance illustrated in FIG. 3.

FIG. 6A illustrates a detailed process provided to explain the method of manufacturing a semiconductor device with negative differential transconductance illustrated in FIG. 5.

FIG. 6B illustrates a detailed process provided to explain the method of manufacturing a semiconductor device with negative differential transconductance illustrated in FIG. 5.

FIG. 6C illustrates a detailed process provided to explain the method of manufacturing a semiconductor device with negative differential transconductance illustrated in FIG. 5.

FIG. 6D illustrates a detailed process provided to explain the method of manufacturing a semiconductor device with negative differential transconductance illustrated in FIG. 5.

FIG. 6E illustrates a detailed process provided to explain the method of manufacturing a semiconductor device with negative differential transconductance illustrated in FIG. 5.

FIG. 6F illustrates a detailed process provided to explain the method of manufacturing a semiconductor device with negative differential transconductance illustrated in FIG. 5.

FIG. 7 shows an optical microscope image of a semiconductor device with negative differential transconductance in accordance with various embodiments described herein.

FIG. 8 shows the result of electrical measurements to explain characteristics of the semiconductor device with negative differential transconductance illustrated in FIG. 7.

FIG. 9 is a diagram provided to explain the operation principle of a source electrode material layer and a semiconductor material layer which are hetero-joined to each other in accordance with various embodiments described herein.

FIG. 10 is a diagram illustrating a ternary inverter capable of outputting three logic states as a semiconductor device with negative differential transconductance in accordance with various embodiments described herein.

FIG. 11 shows the result of electrical measurements to explain characteristics of the ternary inverter capable of outputting three logic states illustrated in FIG. 10.

DETAILED DESCRIPTION

Figure 1A:
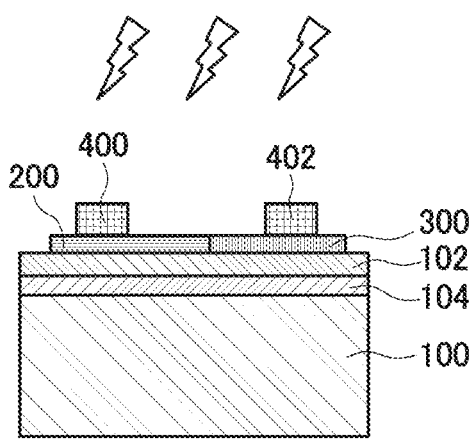
FIG. 1A shows cross-sectional views of a semiconductor device with negative differential transconductance in accordance with various embodiments described herein.

Hereinafter, embodiments of the present disclosure will be described in detail with reference to the accompanying drawings so that the present disclosure may be readily implemented by a person with ordinary skill in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added.

Figure 1B:
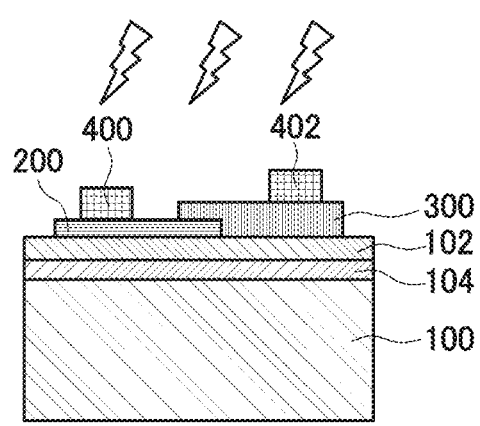
FIG. 1B shows cross-sectional views of a semiconductor device with negative differential transconductance in accordance with various embodiments described herein.

FIG. 1A and FIG. 1B show cross-sectional views of a semiconductor device with negative differential transconductance in accordance with an embodiment of the present disclosure.

The semiconductor device with negative differential transconductance to be described below is just an example of the present disclosure and can be modified in various ways based on its components.

As illustrated in FIG. 1A and FIG. 1B, a semiconductor device with negative differential transconductance includes a substrate 100, a gate electrode 104 formed on the substrate 100, an insulating layer 102 formed on the gate electrode 104, a source electrode material layer 200 formed on the insulating layer 102, a semiconductor material layer 300 formed on the insulating layer 102 to be hetero-joined to the source electrode material layer 200, a source electrode 400 formed on the source electrode material layer 200, and a drain electrode 402 formed on the semiconductor material layer 300. Herein, a work function of the source electrode material layer 200 is controlled by a gate voltage applied through the gate electrode 104, and the source electrode material layer 200 shows negative differential transconductance depending on a level of the gate voltage. The source electrode material layer 200 and the semiconductor material layer 300 which are hetero-joined to each other may be formed to have the same height and to be in vertical contact with each other as illustrated in FIG. 1A. For another example, the semiconductor material layer 300 may be formed to be in vertical contact with the source electrode material layer 200 while covering an area of an upper surface of the source electrode material layer 200 as illustrated in FIG. 1B.

In an embodiment, the semiconductor material layer 300 may be formed of a p-type semiconductor material and may show negative differential transconductance since a current to be generated by an optical signal applied to the semiconductor device is increased as a positive voltage applied as a gate voltage is decreased in value to be closer to 0 and a potential barrier is formed between the source electrode material layer 200 and the semiconductor material layer 300 and the current is decreased as a negative voltage applied as the gate voltage is decreased in value. Details of the negative differential transconductance will be described below with reference to FIG. 7 to FIG. 9.

In another embodiment, the semiconductor material layer 300 may be formed of an n-type semiconductor material and may show negative differential transconductance since a current to be generated by an optical signal applied to the semiconductor device is increased as a negative voltage applied as a gate voltage is increased in value to be closer to 0 and a potential barrier is formed between the source electrode material layer 200 and the semiconductor material layer 300 and the current is decreased as a positive voltage applied as the gate voltage is increased in value.

Figure 2A:
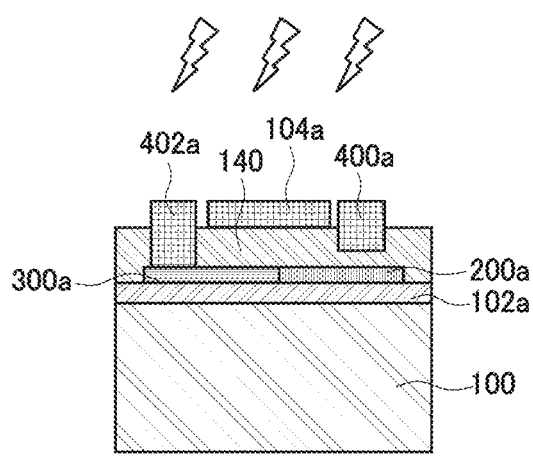
FIG. 2A shows cross-sectional views of a semiconductor device with negative differential transconductance in accordance with various embodiments described herein.
Figure 2B:
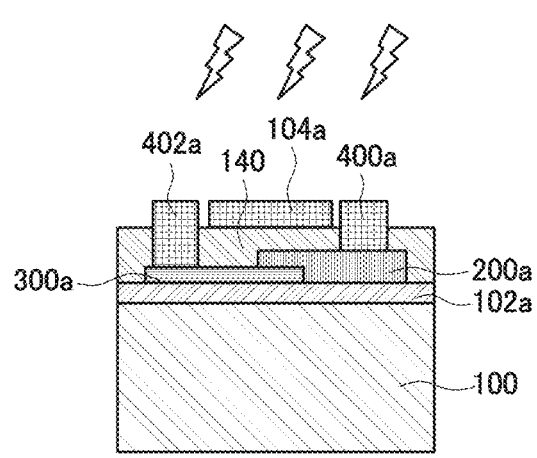
FIG. 2B shows cross-sectional views of a semiconductor device with negative differential transconductance in accordance with various embodiments described herein.

FIG. 2A and FIG. 2B show cross-sectional views of a semiconductor device with negative differential transconductance in accordance with another embodiment of the present disclosure.

Referring to FIG. 2A and FIG. 2B, a semiconductor device with negative differential transconductance includes the substrate 100, an insulating layer 102a formed on the substrate 100, a source electrode material layer 200a and a semiconductor material layer 300a formed on the insulating layer 102a to be hetero-joined to each other, a gate oxide film 140 formed on the source electrode material layer 200a and the semiconductor material layer 300a, a gate electrode 104a formed on the gate oxide film 140, a source electrode 400a formed on the gate oxide film 140 to be in contact with the source electrode material layer 200a, and a drain electrode 402a formed in an area where the semiconductor material layer 300a is located on the gate oxide film 140 as being spaced from the gate electrode 104a and the source electrode 400a. A work function of the source electrode material layer 200a may be controlled by a gate voltage applied through the gate electrode 104a, and the source electrode material layer 200a may show negative differential transconductance depending on a level of the gate voltage. For example, the source electrode material layer 200a and the semiconductor material layer 300a which are hetero-joined to each other may be formed to have the same height and to be in vertical contact with each other as illustrated in FIG. 2. For another example, the source electrode material layer 200 may be formed to be in vertical contact with the semiconductor material layer 300a while covering an area of an upper surface of the semiconductor material layer 300a as illustrated in FIG. 2B.

In an embodiment, the semiconductor material layer 300a may be formed of a p-type semiconductor material and may show negative differential transconductance since a current to be generated by an optical signal applied to the semiconductor device is increased as a positive voltage applied as a gate voltage is decreased in value to be closer to 0 and a potential barrier is formed between the source electrode material layer 200a and the semiconductor material layer 300a and the current is decreased as a negative voltage applied as the gate voltage is decreased in value.

In another embodiment, the semiconductor material layer 300a may be formed of an n-type semiconductor material and may show negative differential transconductance since a current to be generated by an optical signal applied to the semiconductor device is increased as a negative voltage applied as a gate voltage is increased in value to be closer to 0 and a potential barrier is formed between the source electrode material layer 200a and the semiconductor material layer 300a and the current is decreased as a positive voltage applied as the gate voltage is increased in value.

Hereinafter, a method of manufacturing the semiconductor device with negative differential transconductance according to the present disclosure will be described in detail.

FIG. 3 is a flowchart provided to explain a method of manufacturing the semiconductor device with negative differential transconductance illustrated in FIG. 1A and FIG. 1B.

FIG. 4A to FIG. 4E illustrate a detailed process provided to explain the method of manufacturing a semiconductor device with negative differential transconductance illustrated in FIG. 3.

Referring to FIG. 3 to FIG. 4E, a method of manufacturing the semiconductor device with negative differential transconductance according to an embodiment of the present disclosure includes forming the gate electrode 104 on the substrate 100 (S110), forming the insulating layer 102 on the gate electrode 104 (S120), forming the source electrode material layer 200 and the semiconductor material layer 300 on the insulating layer 102 to be hetero-joined to each other (S130), forming the source electrode 400 on the source electrode material layer 200 (S140), and forming the drain electrode 402 on the semiconductor material layer 300 (S150). Herein, a work function of the source electrode material layer 200 may be controlled by a gate voltage applied through the gate electrode 104, and the source electrode material layer 200 may show negative differential transconductance depending on a level of the gate voltage.

For example, referring to FIG. 3 to FIG. 4E, the method of manufacturing the semiconductor device with negative differential transconductance will be described. As illustrated in FIG. 4A, in S110, the gate electrode 104 may be formed on the substrate 100. For example, the substrate 100 may be formed of at least one of silicon (Si) on which an insulating layer such as silicon dioxide ($SiO_2$), aluminum oxide ($Al_2O_3$), or hafnium oxide ($HfO_2$) is grown or deposited, a germanium (Ge) substrate, glass, and a PET film, but may not be limited thereto.

The gate electrode 104 may be formed of titanium (Ti), platinum (Pt), gold (Au), palladium (Pd), chromium (Cr), molybdenum (Mo), super duralumin (Sd), or the like and may also be formed of any conductive material. The gate electrode 104 may be formed by e-beam evaporation, thermal evaporator, sputtering, or the like, but may not be limited thereto.

Then, as illustrated in FIG. 4B, in S120, the insulating layer 102 is formed on the gate electrode 104. The insulating layer 102 may be formed to have various thicknesses of from several nm to several hundred μm and may be formed by growing or depositing a material such as silicon dioxide ($SiO_2$), aluminum oxide ($Al_2O_3$), or hafnium oxide ($HfO_2$) on the gate electrode 104 by e-beam evaporator, atomic layer deposition, or the like.

Then, as illustrated in FIG. 4C, in S130, the source electrode material layer 200 and the semiconductor material layer 300 are formed to be hetero-joined to each other. A representative method for forming layers to be hetero-joined together is a horizontal growth method. Besides, a vertical growth method, a mechanical transfer method, and a transfer method using a transparent and adhesive material such as polydimethylsiloxane (PDMS) or poly(methylmethacrylate) (PMMA) may be used to form the source electrode material layer 200 and the semiconductor material layer 300. For example, the source electrode material layer 200 and the semiconductor material layer 300 may be formed to have the same height and to be in vertical contact with each other as illustrated in FIG. 1A. For another example, the semiconductor material layer 300 may be formed to be in vertical contact with the source electrode material layer 200 while covering an area of an upper surface of the source electrode material layer 200 as illustrated in FIG. 1B.

In S130, the source electrode material layer 200 may be formed first on the insulating layer 102, but the present disclosure may not be limited thereto, and the semiconductor material layer 300 may be formed first on the insulating layer 102 and then the source electrode material layer 200 may be formed to be hetero-joined to the semiconductor material layer 300.

The source electrode material layer 200 is formed of a material whose work function can be controlled by a gate voltage. The material of the source electrode material layer 200 may be desirably graphene and may further include any material whose work function can be controlled by a gate voltage. Representative methods for forming the source electrode material layer 200 include chemical vapor deposition methods such as low-pressure chemical vapor deposition and plasma-enhanced chemical vapor deposition and may further include delamination using a tape, transfer using a polymer, solution-process, and the like, but may not be limited thereto.

Then, the semiconductor material layer 300 is formed to be hetero-joined to the source electrode material layer 200. For example, the semiconductor material layer 300 may be formed of a semiconductor material such as desirably silicon (Si) and germanium (Ge). Besides, the semiconductor material layer 300 may be formed of a semiconductor material such as Group III-V compound semiconductors, oxide semiconductors, polymer semiconductors, or a 2-dimensional semiconductor material such as transition metal dichalcogenide and phosphorene. Further, representative methods for forming the semiconductor material layer 300 include chemical vapor deposition methods such as low-pressure chemical vapor deposition and plasma-enhanced chemical vapor deposition and may further include delamination using a tape, transfer using a polymer, solution-process, and the like, but may not be limited thereto.

Then, as illustrated in FIG. 4D, in S140, the source electrode 400 may be formed on the source electrode material layer 200, and as illustrated in FIG. 4E, in S150, the drain electrode 402 may be formed on the semiconductor material layer 300. For example, methods for forming the source electrode 400 and the drain electrode 402 may include any method capable of forming an electrode pattern, such as mask aligning using a photoresist, e-beam lithography, stepper, and the like. Further, the method for forming the source electrode 400 and the drain electrode 402 may include methods of depositing a metal material, such as e-beam evaporation, thermal deposition, physical vapor deposition (PVD) and the like.

Further, a material of the source electrode 400 and the drain electrode 402 may include any electrode material which can be in contact with the source electrode material layer 200 whose work function can be controlled by a gate voltage applied through the gate electrode 104 formed of titanium (Ti), platinum (Pt), gold (Au), palladium (Pd), chromium (Cr), molybdenum (Mo), super duralumin (Sd), or the like and the semiconductor material layer 300 having a band gap.

Furthermore, as illustrated in FIG. 4E, when an optical signal is applied to the manufactured device, the device may have negative differential transconductance. The wavelength of the applied optical signal includes all wavelengths of light including ultraviolet light, visible light, and infrared light, and the intensity of light may include from 1 pW to 1 mW. Further, hydrogen-neon laser is representatively used as light to be injected into the device. Besides, any machine that irradiates light having a predetermined wavelength and intensity such as ruby laser, argon laser, carbon dioxide laser, diode laser, excimer laser, or the like can be used.

Hereinafter, an explanation of the components that perform the same function as those illustrated in FIG. 3 to FIG. 4E will be omitted.

Figure 5:
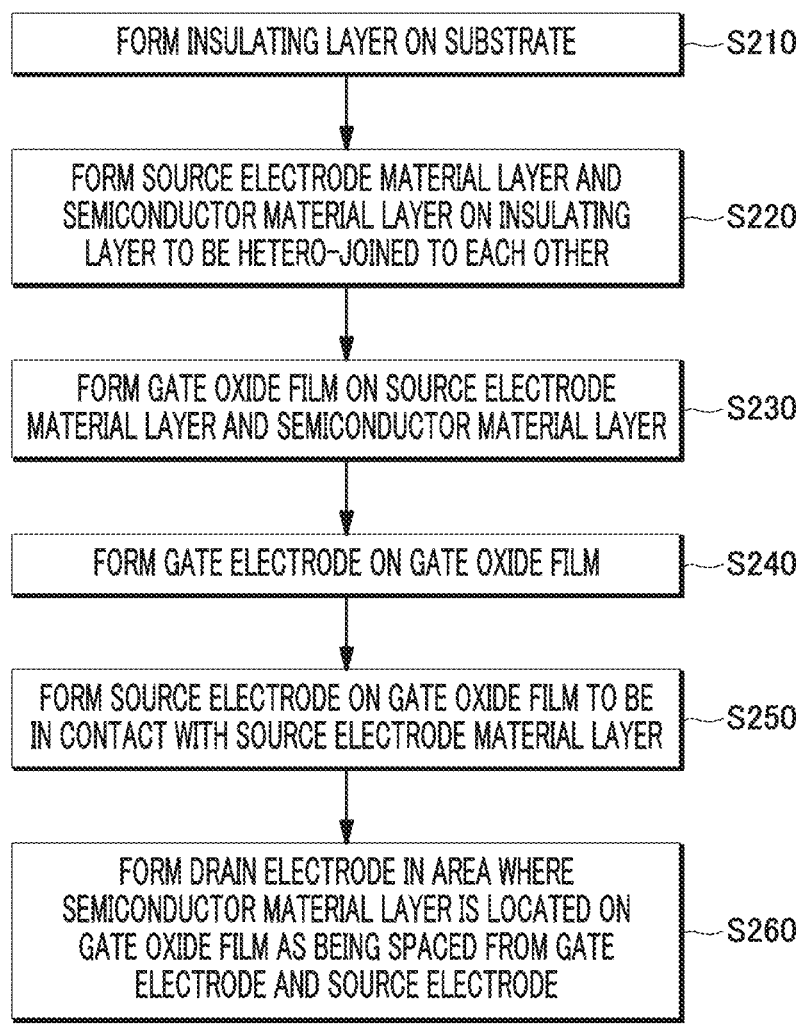
FIG. 5 is a flowchart provided to explain a method of manufacturing the semiconductor device with negative differential transconductance illustrated in FIG. 2A and FIG. 2B.

FIG. 5 is a flowchart provided to explain a method of manufacturing the semiconductor device with negative differential transconductance illustrated in FIG. 2A and FIG. 2B.

FIG. 6A to FIG. 6F illustrate a detailed process provided to explain the method of manufacturing a semiconductor device with negative differential transconductance illustrated in FIG. 5.

Referring to FIG. 5 to FIG. 6F, a method of manufacturing the semiconductor device with negative differential transconductance according to another embodiment of the present disclosure includes forming the insulating layer 102a on the substrate 100 (S210), forming the source electrode material layer 200a and the semiconductor material layer 300a on the insulating layer 102a to be hetero-joined to each other (S220), forming the gate oxide film 140 on the source electrode material layer 200a and the semiconductor material layer 300a (S230), forming the gate electrode 104a on the gate oxide film 140 (S240), forming the source electrode 400a on the gate oxide film 140 to be in contact with the source electrode material layer 200a (S250), and forming the drain electrode 402a in an area where the semiconductor material layer 300a is located on the gate oxide film 140 as being spaced from the gate electrode 104a and the source electrode 400a (S260). A work function of the source electrode material layer 200a may be controlled by a gate voltage applied through the gate electrode 104a, and the source electrode material layer 200a may show negative differential transconductance depending on a level of the gate voltage.

For example, referring to FIG. 5 to FIG. 6F, the method of manufacturing the semiconductor device with negative differential transconductance will be described. As illustrated in FIG. 6A, in S210, the insulating layer 102a may be formed on the substrate 100.

Then, as illustrated in FIG. 6B, in S220, the source electrode material layer 200a and the semiconductor material layer 300a may be formed on the insulating layer 102a to be hetero-joined to each other. As such, a representative method for forming layers to be hetero-joined together is a horizontal growth method. Besides, a vertical growth method, a mechanical transfer method, and a transfer method using a transparent and adhesive material such as polydimethylsiloxane (PDMS) or poly(methylmethacrylate) (PMMA) may be used to form the source electrode material layer 200a and the semiconductor material layer 300a. For example, the semiconductor material layer 300a and the source electrode material layer 200a may be formed to have the same height and to be in vertical contact with each other as illustrated in FIG. 2A. For another example, the source electrode material layer 200a may be formed to be in vertical contact with the semiconductor material layer 300a while covering an area of an upper surface of the semiconductor material layer 300a as illustrated in FIG. 2B.

In S220, the semiconductor material layer 300a may be formed first n the insulating layer 102a, but the present disclosure may not be limited thereto, and the source electrode material layer 200a may be formed first on the insulating layer 102a and then the semiconductor material layer 300a may be formed to be hetero-joined to the source electrode material layer 200a.

The semiconductor material layer 300a may be formed of a semiconductor material such as desirably silicon (Si) and germanium (Ge). Besides, the semiconductor material layer 300a may be formed of a semiconductor material such as Group III-V compound semiconductors, oxide semiconductors, polymer semiconductors, or a 2-dimensional semiconductor material such as transition metal dichalcogenide and phosphorene. Further, representative methods for forming the semiconductor material layer 300a include chemical vapor deposition methods such as low-pressure chemical vapor deposition and plasma-enhanced chemical vapor deposition and may further include delamination using a tape, transfer using a polymer, solution-process, and the like, but may not be limited thereto.

Then, the source electrode material layer 200a may be formed to be hetero-joined to the semiconductor material layer 300a. That is, the source electrode material layer 200a which has a band gap and whose work function can be controlled by a gate voltage may be formed to be in vertical contact with the semiconductor material layer 300a. For example, the source electrode material layer 200a may be formed of a material whose work function can be controlled by a gate voltage. The material of the source electrode material layer 200a may be desirably graphene and may further include any material whose work function can be controlled by a gate voltage. Representative methods for forming the source electrode material layer 200a include chemical vapor deposition methods such as low-pressure chemical vapor deposition and plasma-enhanced chemical vapor deposition and may further include delamination using a tape, transfer using a polymer, solution-process, and the like, but may not be limited thereto.

Then, as illustrated in FIG. 6C, in S230, the gate oxide film and insulator 140 may be formed on the source electrode material layer 200a and the semiconductor material layer 300a. The gate oxide film and insulator 140 may be formed using silicon dioxide ($SiO_2$), aluminum oxide ($Al_2O_3$), or hafnium oxide ($HfO_2$), ion-gel, h-BN, or the like and may include any insulator which can be used to apply a gate voltage. Further, methods for forming the gate oxide film and insulator 140 may include e-beam evaporation, thermal evaporation, chemical vapor deposition, sputtering, atomic layer deposition, and the like, but may not be limited thereto.

Then, as illustrated in FIG. 6D, in S240, the gate electrode 104a is formed on the gate oxide film 140. The gate electrode 104a may be formed of titanium (Ti), platinum (Pt), gold (Au), palladium (Pd), chromium (Cr), molybdenum (Mo), super duralumin (Sd), or the like and may also be formed of any conductive material. Then, as illustrated in FIG. 6E, in S250, the source electrode 400a may be formed on the gate oxide film 140 to be in contact with the source electrode material layer 200a. Then, as illustrated in FIG. 6F, in S260, the drain electrode 402a may be formed in an area where the semiconductor material layer 300a is located on the gate oxide film 140 as being spaced from the gate electrode 104a and the source electrode 400a. Accordingly, the gate electrode 104a is located between the source electrode 400a and the drain electrode 402a.

Furthermore, as illustrated in FIG. 6F, when an optical signal is applied to the manufactured device, the device may have negative differential transconductance. The wavelength of the applied optical signal includes all wavelengths of light including ultraviolet light, visible light, and infrared light, and the intensity of light may include from 1 pW to 1 mW.

Hereinafter, the operation principle of a device with negative differential transconductance based on 2-dimensional semiconductor materials will be described with reference to FIG. 7 to FIG. 9.

FIG. 7 shows an optical microscope image of a semiconductor device with negative differential transconductance in accordance with an embodiment of the present disclosure.

FIG. 8 shows the result of electrical measurements to explain characteristics of the semiconductor device with negative differential transconductance illustrated in FIG. 7.

FIG. 9 is a diagram provided to explain the operation principle of a source electrode material layer and a semiconductor material layer which are hetero-joined to each other in accordance with an embodiment of the present disclosure.

FIG. 7 is an optical microscope image of a semiconductor device with negative differential transconductance manufactured according to an embodiment of the present disclosure. The source electrode material layers 200 and 200a were formed using graphene which is one of 2-dimensional materials which work function can be controlled by a gate voltage, and the semiconductor material layers 300 and 300a were formed using tungsten diselenide which is one of 2-dimensional materials. For example, graphene was formed by chemical vapor deposition and tungsten diselenide was transferred onto the substrate by mechanical delamination using a tape. The formed tungsten diselenide was vertically transferred onto the graphene by mechanical transfer. Then, the source electrodes 400 and 400a and the drain electrodes 402 and 402a were formed on the formed graphene-tungsten diselenide heterojunction using a contact aligning method.

FIG. 8 shows the result of measurements of currents (A) when applying a constant drain voltage to the formed graphene-tungsten diselenide layer (source electrode material layer and semiconductor material layer) and then applying a gate voltage (V) of from 30 V to −30 V. According to the result of electrical measurements when injecting a laser having a wavelength (λ) of 520 nm to a surface of the device under these conditions, although the gate voltage (V) was increased in a negative direction, the current (A) was decreased. This confirms that the graphene-tungsten diselenide heterojunction-based device has negative differential transconductance.

Herein, tungsten diselenide can be substituted with a p-type semiconductor. The operation principle of a graphene-p-type semiconductor heterojunction-based device will be described with reference to FIG. 9.

Referring to FIG. 9, in the case where a positive gate voltage is applied, electrons and holes generated by an applied optical signal are collected from a source electrode (graphene) and a drain electrode (metal), respectively. As the applied gate voltage is decreased, a strong electric field is formed in a channel. Thus, more electrons and holes generated by the optical signal are collected. Therefore, a current is increased. In the case where a negative gate voltage is applied, a potential barrier is formed between the source electrode (graphene) and the channel (p-type semiconductor). Due to the potential barrier, electrons generated by the optical signal cannot be collected from the source electrode (graphene) any longer. Therefore, although the gate voltage is increased in a negative direction, the current is observed as being decreased.

In contrast, according to the operation principle of a graphene-n-type semiconductor heterojunction-based device, in the case where a negative gate voltage is applied, electrons and holes generated by an applied optical signal are collected from a drain electrode (metal) and a source electrode (graphene), respectively. As the applied gate voltage is increased, a strong electric field is formed in a channel. Thus, more electrons and holes generated by the optical signal are collected. Therefore, a current is increased. In the case where a positive gate voltage is applied, a potential barrier is formed between the source electrode (graphene) and the channel (n-type semiconductor). Due to the potential barrier, holes generated by the optical signal cannot be collected from the source electrode (graphene) any longer. Therefore, although the gate voltage is increased in a positive direction, the current is observed as being decreased.

Hereinafter, a ternary inverter capable of outputting three logic states as a semiconductor device with negative differential transconductance according to an embodiment of the present disclosure will be described.

FIG. 10 is a diagram illustrating a ternary inverter capable of outputting three logic states as a semiconductor device with negative differential transconductance in accordance with an embodiment of the present disclosure.

FIG. 11 shows the result of electrical measurements to explain characteristics of the ternary inverter capable of outputting three logic states illustrated in FIG. 10.

Referring to FIG. 10, a ternary inverter capable of outputting three logic states includes a first switching device 10 and a second switching device 20 connected in series between a power voltage 30 and a ground port 40. Input data are applied through gate electrodes of the first switching device 10 and the second switching device 20, output data are output through connection nodes of the first switching device 10 and the second switching device 20, and any one of the first switching device 10 and the second switching device 20 may be a semiconductor device that has two ranges of channel resistance depending on the input data and the other may be a semiconductor device that shows negative differential transconductance depending on the input data and has three ranges of channel resistance.

Referring to FIG. 1A, FIG. 1B and FIG. 10, the first switching device 10 may be a PMOS transistor and the second switching device 20 may be a switching device with negative differential transconductance. In this case, the second switching device 20 may include the substrate 100, the gate electrode 104 formed on the substrate 100, the insulating layer 102 formed on the gate electrode 104, the source electrode material layer 200 formed on the insulating layer 102, the semiconductor material layer 300 formed on the insulating layer 102 to be hetero-joined to the source electrode material layer 200, the source electrode 400 formed on the source electrode material layer 200, and the drain electrode 402 formed on the semiconductor material layer 300, and a work function of the source electrode material layer 200 may be controlled by a gate voltage applied through the gate electrode 104, as described above with reference to FIG. 1A and FIG. 1B. In this case, if input data are defined by a first voltage range to a second voltage range, a channel resistance of the first switching device 10 becomes lower than that of the second switching device 20, and, thus, the power voltage 30 may be output as output data. If the input data are defined by a third voltage range to a fourth voltage range, a channel resistance of the first switching device 10 becomes equal or similar to that of the second switching device 20, and, thus, a voltage equivalent to ½ of the power voltage 30 may be output as the output data. If the input data are defined by a fifth voltage range to a sixth voltage range, a channel resistance of the first switching device 10 becomes higher than that of the second switching device 20, and, thus, the ground voltage 40 may be output as the output data. There is an increase from the first voltage to the sixth voltage in sequence. The first voltage to the third voltage may have negative values and the fourth voltage to the sixth voltage may have positive values. For example, as illustrated in FIG. 11, the first voltage, the second voltage, the third voltage, the fourth voltage, the fifth voltage, and the sixth voltage may be −30 V, −15 V, −5 V, 5 V, 15 V, and 30 V, respectively.

Further, the first switching device 10 may be an NMOS transistor and the second switching device 20 may be a switching device with negative differential transconductance and may include the substrate 100, the gate electrode 104 formed on the substrate 100, the insulating layer 102 formed on the gate electrode 104, the source electrode material layer 200 formed on the insulating layer 102, the semiconductor material layer 300 formed on the insulating layer 102 to be hetero-joined to the source electrode material layer 200, the source electrode 400 formed on the source electrode material layer 200, and the drain electrode 402 formed on the semiconductor material layer 300. Herein, a work function of the source electrode material layer 200 may be controlled by a gate voltage applied through the gate electrode 104. In this case, if input data are defined by a first voltage range to a second voltage range, a channel resistance of the first switching device 10 becomes higher than that of the second switching device 20, and, thus, the ground voltage 40 may be output as output data. If the input data are defined by a third voltage range to a fourth voltage range, a channel resistance of the first switching device 10 becomes equal or similar to that of the second switching device 20, and, thus, a voltage equivalent to ½ of the power voltage 30 may be output as the output data. If the input data are defined by a fifth voltage range to a sixth voltage range, a channel resistance of the first switching device 10 becomes lower than that of the second switching device 20, and, thus, the power voltage 30 may be output as the output data. There is an increase from the first voltage to the sixth voltage in sequence. The first voltage to the third voltage may have negative values and the fourth voltage to the sixth voltage may have positive values.

Referring to FIG. 2A, FIG. 2B and FIG. 10, the first switching device 10 may be a PMOS transistor and the second switching device 20 may be a switching device with negative differential transconductance and may include the substrate 100, the insulating layer 102a formed on the substrate 100, the source electrode material layer 200a and the semiconductor material layer 300a formed on the insulating layer 102a to be hetero-joined to each other, the gate oxide film 140 formed on the source electrode material layer 200a and the semiconductor material layer 300a, the gate electrode 104a formed on the gate oxide film 140, the source electrode 400a formed on the gate oxide film 140 to be in contact with the source electrode material layer 200a, and the drain electrode 402a formed in an area where the semiconductor material layer 300a is located on the gate oxide film 140 as being spaced from the gate electrode 104a and the source electrode 400a, and a work function of the source electrode material layer 200a may be controlled by a gate voltage applied through the gate electrode 104a. In this case, if input data are defined by a first voltage range to a second voltage range, a channel resistance of the first switching device 10 becomes lower than that of the second switching device 20, and, thus, the power voltage 30 may be output as output data. If the input data are defined by the second voltage to a third voltage range, a channel resistance of the first switching device 10 becomes equal or similar to that of the second switching device 20, and, thus, a voltage equivalent to ½ of the power voltage 30 may be output as the output data. If the input data are defined by the third voltage range to a fourth voltage range, a channel resistance of the first switching device 10 becomes higher than that of the second switching device 20, and, thus, the ground voltage 40 may be output as the output data. There is an increase from the first voltage to the sixth voltage in sequence. The first voltage to the third voltage may have negative values and the fourth voltage to the sixth voltage may have positive values.

Further, the first switching device 10 may be an NMOS transistor and the second switching device 20 may be a switching device with negative differential transconductance and may include the substrate 100, the insulating layer 102a formed on the substrate 100, the source electrode material layer 200a and the semiconductor material layer 300a formed on the insulating layer 102a to be hetero-joined to each other, the gate oxide film 140 formed on the source electrode material layer 200a and the semiconductor material layer 300a, the gate electrode 104a formed on the gate oxide film 140, the source electrode 400a formed on the gate oxide film 140 to be in contact with the source electrode material layer 200a, and the drain electrode 402a formed in an area where the semiconductor material layer 300a is located on the gate oxide film 140 as being spaced from the gate electrode 104a and the source electrode 400a, and a work function of the source electrode material layer 200a may be controlled by a gate voltage applied through the gate electrode 104a. In this case, if input data are defined by a first voltage range to a second voltage range, a channel resistance of the first switching device 10 becomes higher than that of the second switching device 20, and, thus, the ground voltage 40 may be output as output data. If the input data are defined by the second voltage to a third voltage range, a channel resistance of the first switching device 10 becomes equal or similar to that of the second switching device 20, and, thus, a voltage equivalent to ½ of the power voltage 30 may be output as the output data. If the input data are defined by the third voltage range to a fourth voltage range, a channel resistance of the first switching 10 becomes lower than that of the second switching device 20, and, thus, the power voltage 30 may be output as the output data. There is an increase from the first voltage to the sixth voltage in sequence. The first voltage to the third voltage may have negative values and the fourth voltage to the sixth voltage may have positive values.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF REFERENCE NUMERALS

1: Ternary inverter
10: First switching device
20: Second switching device
100: Substrate
104, 104a: Gate electrode
102, 102a: Insulating layer 140: Oxide film, Insulator
200, 200a: Source electrode material layer
300, 300a: Semiconductor material layer
400, 400a: Source electrode
402, 402a: Drain electrode

We claim:

1. A semiconductor device with negative differential transconductance, comprising:
   a substrate;
   a gate electrode formed on the substrate;
   an insulating layer formed on the gate electrode;
   a source electrode material layer formed on the insulating layer;
   a semiconductor material layer formed on the insulating layer to be hetero-joined to the source electrode material layer;
   a source electrode formed on the source electrode material layer; and
   a drain electrode formed on the semiconductor material layer,
   wherein a work function of the source electrode material layer is controlled by a gate voltage applied through the gate electrode, and
   wherein the source electrode material layer shows negative differential transconductance depending on a level of the gate voltage.

2. The semiconductor device of claim 1, wherein the semiconductor material layer is formed of a p-type semiconductor material, and the semiconductor material layer shows the negative differential transconductance since a current to be generated by an optical signal applied to the semiconductor device is increased as a positive voltage applied as the gate voltage is decreased in value to be closer to 0 and a potential barrier is formed between the source electrode material layer and the semiconductor material layer and the current is decreased as a negative voltage applied as the gate voltage is decreased in value.

3. The semiconductor device of claim 1, wherein the semiconductor material layer is formed of an n-type semiconductor material, and the semiconductor material layer shows the negative differential transconductance since a current to be generated by an optical signal applied to the semiconductor device is increased as a negative voltage applied as the gate voltage is increased in value to be closer to 0 and a potential barrier is formed between the source electrode material layer and the semiconductor material layer and the current is decreased as a positive voltage applied as the gate voltage is increased in value.

4. The semiconductor device of claim 1, wherein the source electrode material layer is formed of graphene, and the semiconductor material layer is formed of at least one of silicon (Si), germanium (Ge), compound semiconductors of elements from Groups III-V of the periodic table, oxide semiconductors, polymer semiconductors, transition metal dichalcogenide, and phosphorene.

5. A semiconductor device with negative differential transconductance, comprising:
   a substrate;
   an insulating layer formed on the substrate;
   a source electrode material layer and a semiconductor material layer formed on the insulating layer to be hetero-joined to each other;
   a gate oxide film formed on the source electrode material layer and the semiconductor material layer;
   a gate electrode formed on the gate oxide film;
   a source electrode formed on the gate oxide film to be in contact with the source electrode material layer; and
   a drain electrode formed on the semiconductor material layer and being spaced apart from the gate electrode and the source electrode,
   wherein a work function of the source electrode material layer is controlled by a gate voltage applied through the gate electrode, and the source electrode material layer shows negative differential transconductance depending on a level of the gate voltage.

6. The semiconductor device of claim 5, wherein the semiconductor material layer is formed of a p-type semiconductor material, and the semiconductor material layer shows the negative differential transconductance since a current to be generated by an optical signal applied to the semiconductor device is increased as a positive voltage applied as the gate voltage is decreased in value to be closer to 0 and a potential barrier is formed between the source electrode material layer and the semiconductor material layer and the current is decreased as a negative voltage applied as the gate voltage is decreased in value.

7. The semiconductor device of claim 5, wherein the semiconductor material layer is formed of an n-type semiconductor material, and the semiconductor material layer shows the negative differential transconductance since a current to be generated by an optical signal applied to the semiconductor device is increased as a negative voltage applied as the gate voltage is increased in value to be closer to 0 and a potential barrier is formed between the source electrode material layer and the semiconductor material layer and the current is decreased as a positive voltage applied as the gate voltage is increased in value.

8. The semiconductor device of claim 5, wherein the source electrode material layer is formed of graphene, and the semiconductor material layer is formed of at least one of silicon (Si), germanium (Ge), compound semiconductors of elements from Groups III-V of the periodic table, oxide semiconductors, polymer semiconductors, transition metal dichalcogenide, and phosphorene.

9. A method of manufacturing a semiconductor device with negative differential transconductance, the method comprising:
   forming a gate electrode on a substrate;
   forming an insulating layer on the gate electrode;
   forming a source electrode material layer and a semiconductor material layer on the insulating layer to be hetero-joined to each other;
   forming a source electrode on the source electrode material layer; and
   forming a drain electrode on the semiconductor material layer,
   wherein a work function of the source electrode material layer is controlled by a gate voltage applied through the gate electrode, and the source electrode material layer shows negative differential transconductance depending on a level of the gate voltage.

10. A method of manufacturing a semiconductor device with negative differential transconductance, the method comprising:
    forming an insulating layer on a substrate;
    forming a source electrode material layer and a semiconductor material layer on the insulating layer to be hetero-joined to each other;
    forming a gate oxide film on the source electrode material layer and the semiconductor material layer;
    forming a gate electrode on the gate oxide film;
    forming a source electrode on the gate oxide film to be in contact with the source electrode material layer; and forming a drain electrode on the semiconductor material layer, the drain electrode being spaced apart from the gate electrode and the source electrode, wherein a work function of the source electrode material layer is controlled by a gate voltage applied through the gate electrode, and the source electrode material layer shows negative differential transconductance depending on a level of the gate voltage.

* * * * *